United States Patent [19]
Morita et al.

[11] Patent Number: 5,235,240
[45] Date of Patent: Aug. 10, 1993

[54] ELECTRODES AND THEIR LEAD STRUCTURES OF AN ULTRATHIN PIEZOELECTRIC RESONATOR

[75] Inventors: Takao Morita; Osamu Ishii; Takehumi Kurosaki, all of Kanagawa, Japan

[73] Assignee: Toyo Communication Equipment Co., Ltd., Kanagawa, Japan

[21] Appl. No.: 809,512

[22] PCT Filed: May 9, 1991

[86] PCT No.: PCT/JP91/00615
§ 371 Date: Jan. 24, 1992
§ 102(e) Date: Jan. 24, 1992

[87] PCT Pub. No.: WO91/19351
PCT Pub. Date: Dec. 12, 1991

[30] Foreign Application Priority Data

| May 25, 1990 | [JP] | Japan | 2-136134 |
| Jun. 29, 1990 | [JP] | Japan | 2-172114 |
| Jul. 9, 1990 | [JP] | Japan | 2-179577 |
| Sep. 5, 1990 | [JP] | Japan | 2-235041 |
| Sep. 5, 1990 | [JP] | Japan | 2-235042 |

[51] Int. Cl.$^5$ ............................................. H01L 41/08
[52] U.S. Cl. ...................... 310/365; 310/366; 310/367; 310/344
[58] Field of Search .................. 310/365-369, 310/344, 348, 320, 324

[56] References Cited

U.S. PATENT DOCUMENTS

| 3,694,677 | 9/1972 | Guttwein et al. | 310/369 |
| 3,891,872 | 6/1975 | Nagata et al. | 310/320 |
| 4,439,706 | 3/1984 | Matsuoka et al. | 310/348 X |
| 4,517,485 | 5/1985 | Berte et al. | 310/369 X |
| 4,720,651 | 1/1988 | Nakazawa et al. | 310/369 |

FOREIGN PATENT DOCUMENTS

| 2547458 | 12/1984 | France | 310/369 |
| 0021114 | 2/1982 | Japan | 310/365 |
| 58-137318 | 8/1983 | Japan . | |
| 0157213 | 9/1983 | Japan | 310/365 |
| 59-31889 | 8/1984 | Japan . | |
| 0141813 | 8/1984 | Japan | 310/324 |
| 60-210018 | 10/1985 | Japan . | |
| 62-185403 | 8/1987 | Japan . | |
| 63-144727 | 9/1988 | Japan . | |

*Primary Examiner*—Mark O. Budd
*Attorney, Agent, or Firm*—Fish & Richardson

[57] ABSTRACT

In an ultrathin piezoelectric resonator including an ultrathin vibratory portion and thick frame-like marginal portion formed integrally therewith for supporting it around, an electrode and an electrode lead pattern extending therefrom are provided on one surface of the vibratory portion and an electrode is provided on the other surface of the vibratory portion in an area except at least an area corresponding to the electrode lead pattern, thereby preventing that a capacitor is formed between the electrode and the electrode pattern deposited on the opposite surfaces of the vibratory portion and increases the parallel capacitance of the resonator. The electrode lead pattern is formed narrow to reduce an ohmic loss and suppress a spurious resonance. A through hole is made in the frame-like marginal portion and extends therethrough in its thickwise direction. By electrically connecting via the through hole an electrode lead portion on one surface of the frame-like marginal portion and a terminal pad on the other surface thereof, it is possible to ensure good conduction between a conductive film on the bottom of a resonator package and the electrode on the said other surface of the vibratory portion on the side where a cavity is provided.

7 Claims, 11 Drawing Sheets

ELECTRODES AND THEIR LEAD STRUCTURES OF AN ULTRATHIN PIEZOELECTRIC RESONATOR

TECHNICAL FIELD

The present invention relates to electrodes and their lead structure of an ultrathin piezoelectric resonator whose fundamental frequency is as high as tens to hundreds of megahertz.

PRIOR ART

In recent years there has been a strong and growing demand for high frequency operation and high frequency stability of various pieces of electronic and communication equipment. An ordinary AT cut quartz crystal resonator, which has heretofore been used widely as a piezoelectric device (such as a resonator or filter), has a very excellent temperature-frequency characteristic; however, since its resonance frequency is in inverse proportion to the thickness of AT cut quartz crystal plate, the fundamental frequency of this kind of resonator with a mechanical strength sufficient for practical use is around 40 MHz at the highest.

There has also been widely employed what is called overtone oscillation means which extracts a higher order harmonic mode vibration of an AT cut quartz crystal resonator to obtain a frequency which is an odd multiple of the fundamental resonance frequency, but its oscillation circuit calls for an LC tuning circuit including a coil, and hence is not suitable for fabrication as a semiconductor IC, besides the overtone oscillation circuit may sometimes be difficult to activate because such a resonator has a large capacitance ratio and consequently a high impedance level.

On the other hand, a surface acoustic wave resonator, whose oscillation frequency is determined by the pitch of electrode fingers of an interdigital transducer, has come to be able to output a maximum of 1 GHz or so due to the progress in photolithography, the resonator of this kind possesses a problem as a piezoelectric substrate usable therefor is remarkably inferior to the AT cut quartz crystal in terms of temperature-frequency characteristic.

Figure 16A:
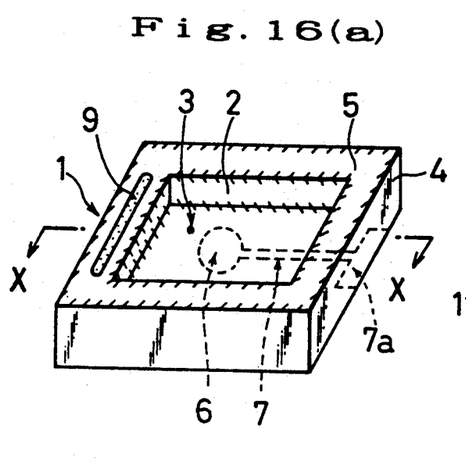
Figure 16B:
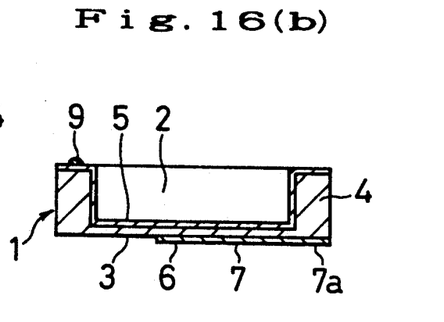

To solve the above-mentioned problems, study has been given such a piezoelectric resonator as shown in FIGS. 16($a$) and ($b$).

The piezoelectric resonator has a cavity 2 provided by machining or etching in one side of a block of AT cut quartz crystal 1 centrally thereof to form a vibratory portion 3, which has a thickness of about 17 $\mu$m, if a fundamental resonance frequency of, say, 100 MHz is desired to obtain.

On the side of the block where the cavity 2 is provided, the ultrathin vibratory portion 3 is edged with and mechanically supported by a thick frame-like marginal portion (or rib) 4 formed integrally therewith.

By depositing a conductive film 5 all over the piezoelectric substrate on the side where the cavity 2 is provided and by depositing a partial electrode 6 and an electrode lead 7 extending therefrom, through use of, for example, vacuum evaporation on the flat surface of the vibratory portion 3 opposite from the cavity 2, it is possible to obtain a resonator of a very high resonance frequency substantially equal to the fundamental resonant frequency of the ultrathin vibratory portion 3 or a filter element of such a high center frequency.

Figure 17:
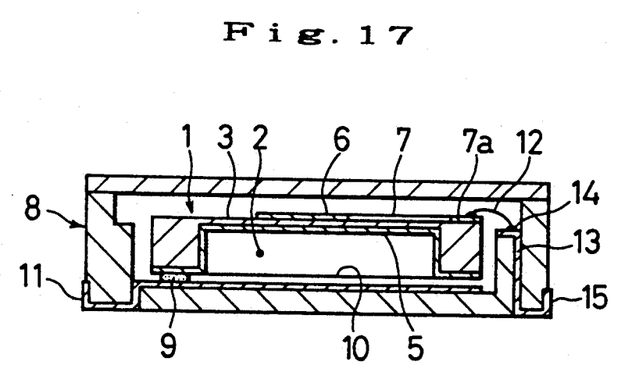
FIG. 17 is a sectional view showing its packaging method.

As can be imagined from its structure, the above-said piezoelectric resonator is suitable for housing in such a flat package as depicted in FIG. 17.

It is customary and technically advantageous to house the piezoelectric resonator upside down—with the cavity 2 of the quartz crystal block 1 facing downward—in the bottom of ceramic or similar dish-like case 8 which is concave centrally thereof and to mechanically bond and electrically connect the overall electrode 5 and a conductive film 10 exposed on the bottom of the concavity of the case 8, by a conductive adhesive 9 laid down in line on the top of one side of the frame-like marginal portion 4.

Incidentally, the conductive film 10 on the bottom of the concavity of the case 8 is connected to a terminal 11 formed at one corner of the case 8 on the underside thereof via a connecting conductor hermetically passing through the case 8.

A pad 7$a$ at one end of the electrode lead 7 extending from the partial electrode 6 of the resonator has a minimum area necessary for connection, by a bonding wire 12, to a pad 14 formed on a stepped portion 13 on the inside of the case 8. The pad 14 is also connected to a terminal 15 provided at another corner of the case 8 on the underside thereof via a connecting conductor which hermetically passes through the case 8.

Figure 18:
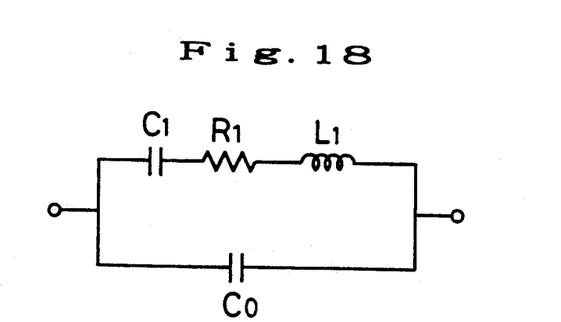
FIG. 18 is an equivalent circuit of a resonator.

The above-described ultrathin resonator studied so for has the overall electrode 5 on the side of the piezoelectric block (i.e. the piezoelectric plate) 1 where the cavity 2 is provided, and hence is easy to manufacture, but the overall electrode 5 and the electrode lead portion 7 extending from the partial electrode 6 are deposited on both sides of the ultrathin vibratory portion 3 and they constitute a capacitor of a large capacity, which causes an increase in a parallel capacitance C0 in an equivalent circuit of the piezoelectric resonator shown in FIG. 18. The increase in the parallel capacitance C0 means an increase in the capacitance ratio $\gamma(=C_0/C_1)$ of the piezoelectric resonator; consequently, in the case of applying the piezoelectric resonator to a voltage controlled quartz crystal oscillator (VCXO), the variable width of its oscillation frequency is limited, and in the case of using it as a band-pass filter, its passband is limited, as is well-known in the art.

It is also self-evident that the reduction of the width of the electrode lead portion 7 with a view to avoiding the increase in the capacitance ratio $\gamma$ will cause an increase in an ohmic loss, directly leading to a reduction in the Q of the resonator or an increase in the insertion loss of the filter.

The present invention is intended to solve the above-mentioned problems of the ultrathin piezoelectric resonator which have been left unsolved so far, and it is a first object of the invention to provide an electrode structure of an ultrathin piezoelectric resonator which is free from various drawbacks attributable to an increase in an equivalent parallel capacitance of the resonator which results from the formation of a capacitor between the overall electrode and the electrode lead portion deposited on both sides of the ultrathin vibratory portion forming the bottom of the cavity made in one side of a block of a piezoelectric material such as quartz crystal.

If the width (the sectional area) of the electrode lead portion 7 extending from the partial electrode 6 deposited opposite the overall electrode 5 on the bottom of the cavity of the piezoelectric plate 1 is selected large enough to make the ohmic loss (i.e. the electrode resistance) negligible, then a resonance is caused by the electrode lead portion 7 serving as a dummy electrode in the vicinity of the point of resonance by the afore mentioned true electrode and the resonance becomes a high-level spurious.

It is therefore a second object of the present invention to provide an electrode lead structure of such an ultrathin piezoelectric resonator which is free from the generation of such a spurious resonance in the case where the width of the electrode lead portion extending from the partial electrode deposited opposite the overall electrode is wide enough to reduce the ohmic loss.

In the above-mentioned ultrathin piezoelectric resonator, aluminum is suitable for use as an electrode material, taking into account the thicknesses of the electrodes 5 and 6 large enough to secure their conductivity and the mass loading effect for entrapping the vibration energy on the partial electrode 6. When the electrodes are thinner than 500 Å, current does not readily flow therethrough, no matter what metal may be used, and hence the electrodes must be formed more than 500 Å thick, but if they are formed thick using a metal of a large density, such as gold, the resonance frequency is excessively reduced by the electrodes; therefore, it is preferable to use aluminum which is a light weight electrode material.

However, the surface of the aluminum readily oxizies to form alumite which is a highly insulating material. When the conductive film 10 on the bottom of the package and the overall electrode 5 are electrically connected by the conductive adhesive 9, conductivity therebetween is insufficient, and consequently, they constitute a capacitance; in the case of an oscillator, an increase in its capacitance ratio will limit the variable range of the oscillation frequency, and in the case of a multimode filter element, the overall electrode 5 will serve as an earth electrode and no sufficient grounding is effected, resulting in the attenuation of the filter becoming insufficient.

Accordingly, a third object of the present invention is to provide an electrode lead structure of the ultrathin piezoelectric resonator which is overcomes the problem of bad conductivity between the electrode lead portion of the resonator and the conductive film of the package leading to its external lead which is caused by the formation of oxide films on the surfaces of the electrode lead portion and the conductive film, so as to improve characteristics of the piezoelectric resonator.

DISCLOSURE OF THE INVENTION

To attain the first object, in the ultrathin piezoelectric resonator of the present invention the electrode lead portion, which extends from the partial electrode provided on one surface of the ultrathin vibratory portion toward one marginal edge of the piezoelectric plate, is formed sufficiently narrow on the vibratory portion but sufficiently wide on the frame-like marginal portion.

In the formation of the cavity in the piezoelectric plate by etching an unetched portion is utilized to increase the wide area of the electrode lead portion and reduce its narrow portion to thereby further reduce the ohmic loss.

In the case where the capacitance ratio $\gamma$ of the resonator is excessively large, the conductive film forming the overall electrode is removed from at least the area corresponding to the electrode lead portion on the ultrathin vibratory portion on the opposite side therefrom.

To attain the second object, in the present invention that portion of electrode lead patterns extending from the partial electrode which is deposited on the ultrathin vibratory portion is formed by a plurality of narrow electrode lead patterns.

To attain the third object, in the ultrathin piezoelectric resonator of the present invention the electrode lead portion extending from the partial electrode toward the frame-like marginal portion and the overall electrode deposited opposite thereto are electrically connected through a through hole made in the frame-like marginal portion thickwise thereof at an appropriate position or a recess made in one end face of the frame-like marginal portion and a pad on the resonator and a pad leading to an external lead of the package are connected by a wire bonding.

BRIEF DESCRIPTION OF THE DRAWINGS

FIGS. 2(a) and (b) are a sectional view and a plane view illustrating an example of the electrode lead structure of the ultrathin piezoelectric resonator according to a second embodiment of the present invention;

FIGS. 9 (a) and (b) are plan views showing different examples of ultrathin multimode filter elements employing the third embodiment of the present invention;

FIGS. 14 (a) and (b) are a plane view showing the construction of a through hole and a sectional view taken on the line C—C in FIG. 14 (a);

FIGS. 15 (a) and (b) are a perspective view of a modified from of the multimode filter element employing the fifth embodiment of the present invention and a diagram showing a manufacturing process of the piezoelectric plate;

FIGS. 16 (a) and (b) are a perspective view illustrating the construction of a conventional ultrathin piezoelectric resonator and a sectional view taken on the line X—X in FIG. 16 (a);

BEST MODE FOR CARRYING OUT THE INVENTION

The present invention will hereinafter be described in detail with reference to its preferred embodiments shown in the accompanying drawings.

To facilitate a better understanding of the present invention, a brief description will be given first of the reason for which the ultrathin piezoelectric resonator, on which the present invention is based, employs the electrode structure which has the overall electrode deposited on the piezoelectric substrate on the side where the cavity is provided and the partial electrode on the opposite side therefrom.

Firstly, it is very difficult, from the viewpoint of vacuum vapor deposition techniques, to form the partial electrode on the vibratory portion in the cavity of the piezoelectric substrate and the narrow electrode lead which extends from the partial electrode climbing over the inner wall of the cavity and a stepped portion contiguous thereto, although the formation of the partial electrode and its lead portion can be carried out by a troublesome method which involves tilting the piezoelectric substrate during the vapor deposition, and in this instance it is not sure to secure the conduction of the electrode lead portion. As a solution to this problem, the overall electrode is formed on the side where the cavity is provided.

Secondly, the resonator of this type is intended primarily for microminiaturization and it is desirable that the piezoelectric substrate has a size of 3 mm by 3 mm or less, for example. Accordingly, the present invention utilizes a method by which a number of chips are formed on one piezoelectric wafer by batch processing and the wafer is cut into individual chips. In this case, since the above-said electrode structure is employed, the overall electrode can be formed simply by evaporating a conductive film all over one side of the wafer and no photomask or mask for photolithography is needed-this improves the efficiency of production, i.e. the yield rate of product, and hence affords reduction of manufacturing costs.

It must be noted that, for the reasons given above, the ultrathin piezoelectric resonator studied by the inventors so far has the overall electrode deposited on the substrate on the side where the cavity is formed.

With the above-mentioned electrode structure, however, the vibratory portion is so thin that a large capacitance is formed between the overall electrode and the extending from the partial electrode lead portion deposited on both sides of the vibratory portion, and as a result, the capacitance ratio of the resonator becomes large, introducing various disadvantages.

To solve this problem, the ultrathin piezoelectric resonator of the present invention employs such an electrode structure as mentioned below.

Figure 1:
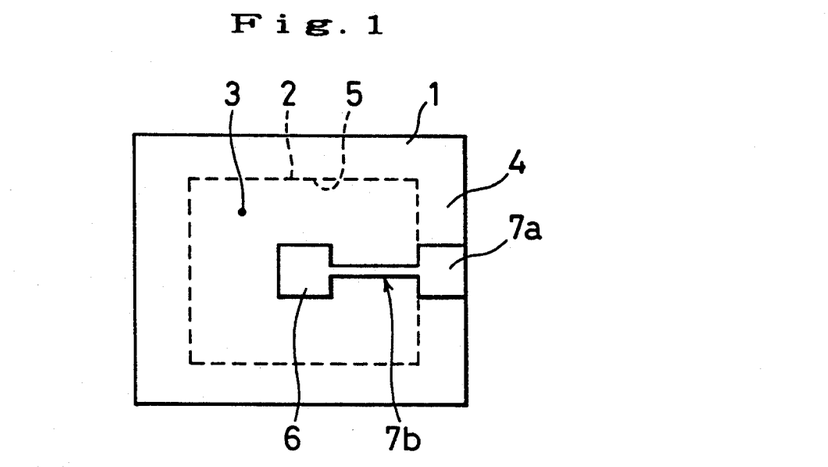
FIG. 1 is a plane view illustrating an example of the electrode lead structure of the ultrathin piezoelectric resonator according to a first embodiment of the present invention.

FIG. 1 is a plane view illustrating the basic construction of a first embodiment of the present invention which is intended to attain the afore-mentioned first object of the invention. The width of that portion $7a$ of the electrode lead 7 extending from the partial electrode 6 which corresponds to the width of the frame-like marginal portion 4 is sufficiently larger than the other portion $7b$ of the electrode lead, the partial electrode 6 being deposited on the side opposite from the overall electrode 5 formed on the ultrathin piezoelectric block 1 on the side where the cavity 2 is provided.

The reason for which the width of the electrode lead portion $7b$ lying on the vibratory portion 3 is minimized but the width of the electrode lead portion $7a$ lying on the frame-like marginal portion 4 is made large is as follows; The vibratory portion 3 is so thin that if wide conductive films are present on both sides thereof in opposing relation to each other, they form a large capacitance, whereas the frame-like marginal portion 4 is so thick that if conductive films are present on both sides thereof, they do not constitute a large capacitance, and hence the capacitance ratio $\gamma$ of the resonator is not seriously affected. Besides, the ohmic loss can be reduced by minimizing the length of the narrow electrode lead portion $7b$.

According to the first embodiment of the present invention, it is possible to suppress the capacitance ratio of the ultrathin piezoelectric resonator to a low value and secure a sufficiently wide variable range of its resonance frequency. In addition, since the area of the electrode lead portion on the vibratory portion of the resonator is smaller than the area of the partial electrode, the generation of unwanted vibration is also negligible.

Figures 2A, 2B:
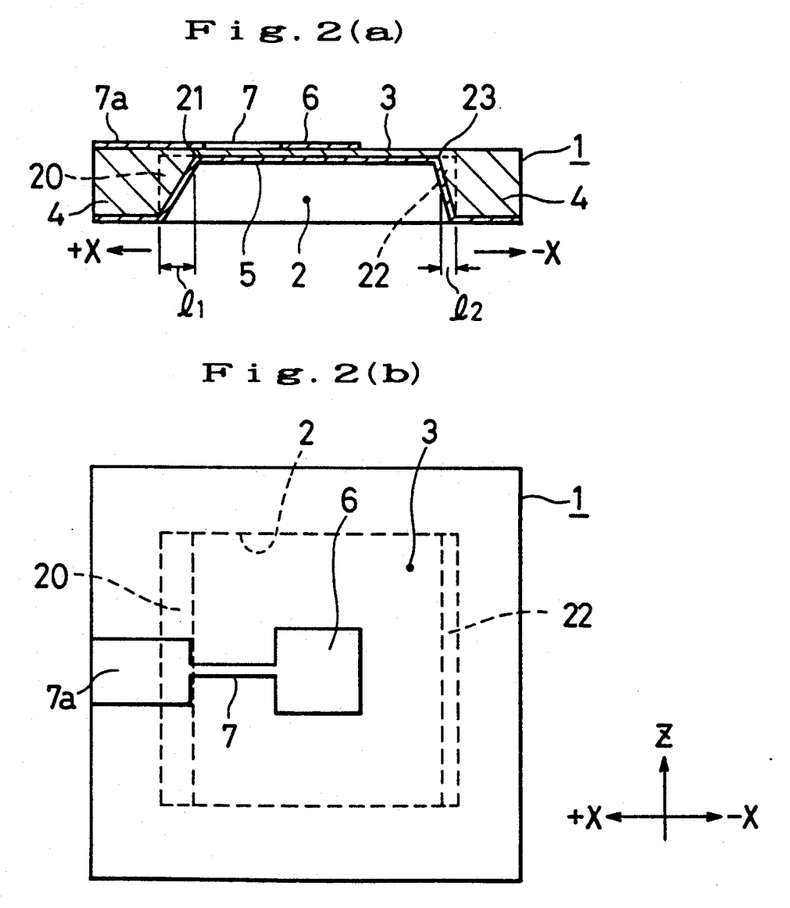

Such an electrode structure as shown in FIG. 2 is effective in further reductions of the capacitance ratio $\gamma$ of the resonator and the ohmic loss.

FIGS. 2 (a) and (b) are a sectional view and a plane view illustrating a second embodiment of the present invention intended to attain the first object of the invention. The narrow electrode lead portion 7, which extends from the partial electrode 6 deposited on the side opposite from the overall electrode 5 formed on the ultrathin piezoelectric block 1 on the side where the cavity 2 is provided, is shortened to a position corresponding to a boundary portion 21 between an inclined unetched portion of the inner wall of the cavity 2 and the vibratory portion 3 and a wide conductor pad $7a$ is provided between the boundary portion 21 and the marginal edge of the piezoelectric block 1.

The reason for which this embodiment adopts such an electrode structure is as follows.

In the formation of the cavity 2 in the AT cut quartz crystal block 1 by etching, unetched portions 20 and 22 are formed on the inner wall of the cavity 2 at a substantially constant angle of inclination in $+x$ and $-x$ directions, respectively, as shown in FIG. 2 (a). Consequently, the inner wall of the cavity 2 formed by etching does not form a vertical wall from the frame-like marginal portion 4 to the vibratory portion 3, but instead the unetched inclined portion of widths $l_1$ and $l_2$ are formed between the vibratory portion 3 and the frame-like marginal portion 4.

Incidentally, the slope of the unetched portion 20 in the $+x$ direction is gentler than the slope of the unetched portion 22 in the $-x$ direction, that is, $l_1 > l_2$.

By depositing the wide conductor pad $7a$ on the same side as the partial electrode 6 over the area between the unetched inclined portion of the width $l_1$ and the marginal edge of the frame-like marginal portion 4, the electrode lead pattern 7 extending between the conductor pad 7a and the partial electrode 6 is narrow but is shortened by $l_1$. This affords further reduction of the ohmic loss of the electrode lead portion 7 and permits holding low the capacitance between the electrode lead portion 7 and the overall electrode 5.

Yet there is a case where, even with the above-described electrode structure, the equivalent parallel capacitance of the resonator is excessively large and the variable range of the resonance frequency is not so wide as to meet a customer's requirement. In such an instance the following electrode structure is used.

FIGS. 3 (a) through (e) illustrate a third embodiment of the present invention intended to attain its first object. FIG. 3 (a) is a plane view showing its basic construction, wherein that portion 16 of the overall electrode 5 deposited on the bottom of the cavity 2 of the ultrathin piezoelectric block 1 which corresponds to the electrode lead portion 7 extending on the vibratory portion 3 from the partial electrode 6 is removed.

In the case where the electrode lead portion 7 of the partial electrode 6 opposite the overall electrode 5 has about the same width as that of the electrode 6, the distance d between the marginal edge of the electrode lead portion 7 and the corresponding marginal edge of that portion 16 of the overall electrode 5 which is to be removed is selected nearly equal to the thickness of the frame-like marginal portion 4 as shown in FIG. 3 (b) so that the capacitance formed by the electrodes on both sides of the vibratory portion 3 can be made substantially negligible.

Figure 3A:
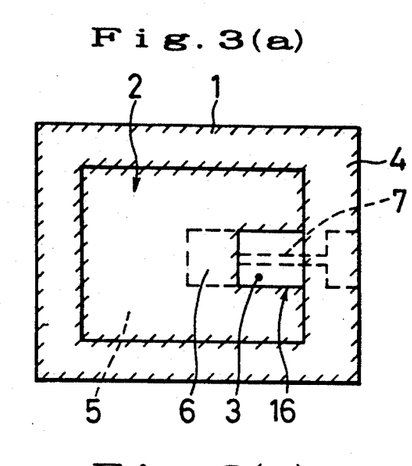
FIGS. 3(a) through (e) are plane views showing different examples of the electrode structure of the ultrathin piezoelectric resonator according to a third embodiment of the present invention.
Figure 3B:
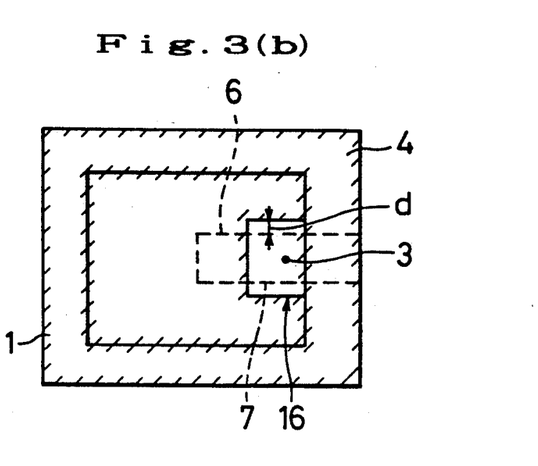
Figure 3C:
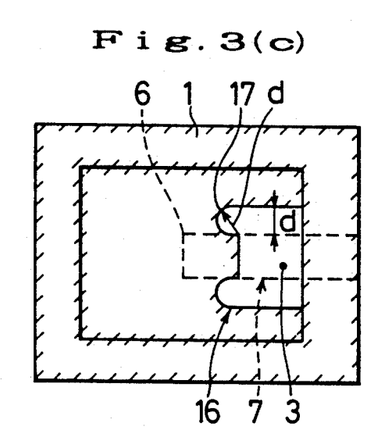
Figure 3D:
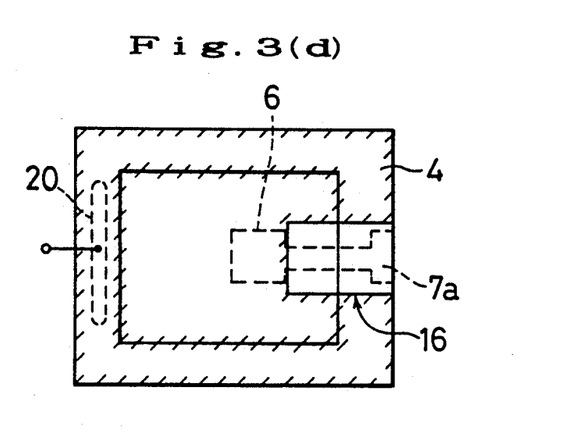
Figure 3E:
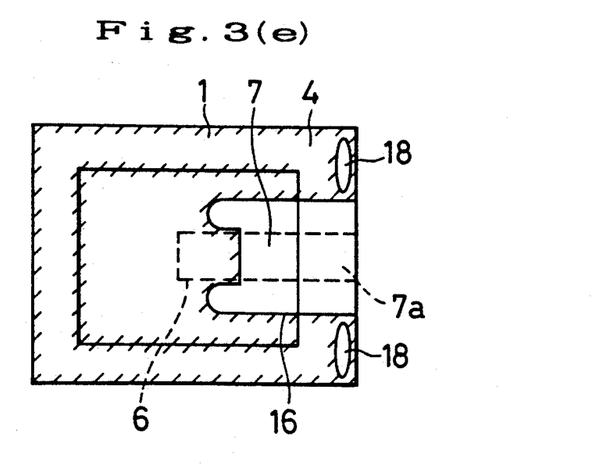

With such an electrode structure, however, a capacitance is formed between the lead portion 7 of the partial electrode 6 and the conductive film extending to the position corresponding to the marginal edge of the partial electrode 6 contiguous to the lead portion 7. The formation of such a capacitance can effectively be prevented by removing not only the above-mentioned portion 16 but also that portion 17 of the overall electrode 5 which corresponds to the above-noted marginal edge of the partial electrode 6, as shown in FIG. 3 (c).

Incidentally, it is necessary to use an evaporation mask of a required shape or photolithography, for selectively removing the overall electrode 5 deposited on the piezoelectric block 1 on the side where the cavity 2 is provided.

In this instance, it will be more effective in reducing the capacitance ratio of the resonator, without increasing the number of manufacturing steps, to extend the area of the overall electrode 5 to be removed to that portion on the frame-like marginal portion 4 of the piezoelectric block 1 which corresponds to the electrode lead portion 7 extending from the partial electrode 6, as shown in FIG. 3 (d) or (e).

While in the above embodiments the overall electrode is not always deposited over the entire area of that side of the piezoelectric block 1 where the cavity 2 is formed, it is self-evident that such an electrode structure increases the number of manufacturing steps and inevitably raises the manufacturing costs; however, the electrode structure makes it possible to meet a customer's specific requirement, for example, a demand for a resonator for a voltage controlled quartz crystal oscillator of a very wide variable frequency range—this more than offsets increased manufacturing costs.

Next, a detailed description will be given of a fourth embodiment of the present invention intended to attain the aforementioned second object of the invention.

Figure 19:
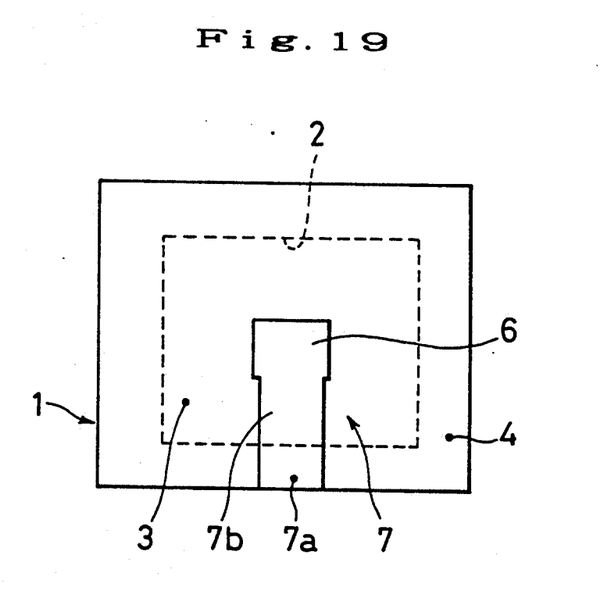
FIG. 19 is a plane view showing an ultrathin piezoelectric resonator having an electrode lead of about the same width as that of the partial electrode.

If the area of the lead portion 7 of the partial electrode 6 opposite the overall electrode 5 is made large to prevent an increase in the ohmic loss in the lead portion 6, the width of the electrode lead portion 7 on the ultrathin vibratory portion 3 becomes about the same as the width of the partial electrode 6 as shown in FIG. 19, because the partial electrode 6 itself is very small. As a result, the overall electrode 5 and the electrode lead portion 7b deposited on both sides of vibratory portion 3 act as dummy electrodes and a spurious resonance of large level is caused by the electrode lead portion 7b in the vicinity of the point of resonance by the true electrode 6 as referred to previously.

To solve this problem, the ultrathin piezoelectric resonator according to the fourth embodiment of the present invention uses such an electrode structure as described below.

Figure 4:
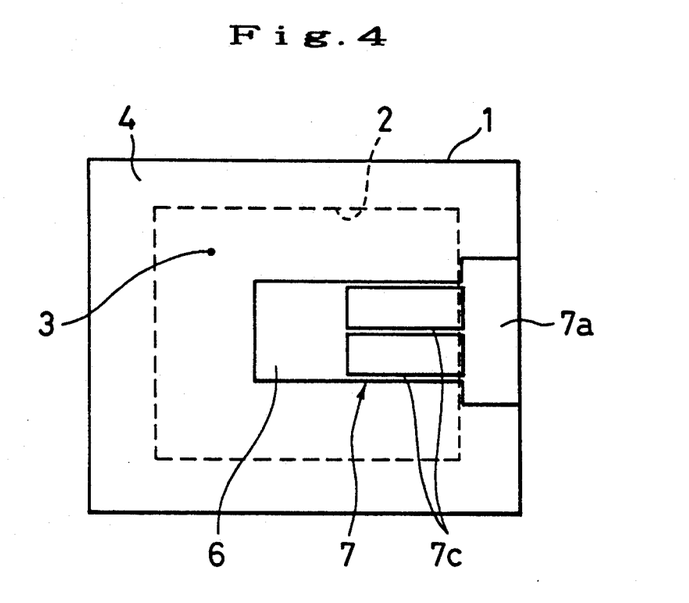
FIG. 4 is a plane view illustrating the basic structure of a fourth embodiment of the present invention.

FIG. 4 is a plane view showing the basic structure of the fourth embodiment of the present invention, wherein that portion of the electrode lead 7 extending from the partial electrode 6 deposited opposite the overall electrode 5 on the piezoelectric block 1 which lies on the ultrathin vibratory portion 3 is formed by a plurality of narrow electrode lead patterns 7c, 7c, . . . in such a manner that the sum of their sectional areas may be sufficiently large enough to prevent an increase in the ohmic loss.

With such an electrode structure, a spurious resonance between the overall electrode 5 and each of the divided electrode lead patterns 7c, 7c, . . . develops at a considerable distance from the point of resonance by the true electrode and its level is also low; hence, various characteristics of the resonator do not suffer any particular deterioration.

In this embodiment the three electrode lead patterns 7c are extended from the partial electrode 6 to the pad 7a on the marginal portion of the piezoelectric block 1 but this is intended as being merely illustrative and the number of electrode lead patterns 7c may be two or more. Moreover, the electrode lead patterns need not always be parallel to each other.

The area of the pad 7a can be set arbitrarily, because it lies on the thick frame-like marginal portion 4 and has nothing to do with the resonance of the vibratory portion 3 (even if it resonates, its resonance frequency is very lower than that of the resonance of the vibratory portion).

According to the fourth embodiment of the present invention, it is possible to essentially preclude the possibility of spurious resonance or cause it to develop at a considerable distance from the resonance point of the resonator, simply by slightly modifying the shape of an evaporation mask or photomask for use in the formation of the partial electrode 6. Accordingly, the electrode structure of this embodiment is markedly effective in maintaining the spurious resonance characteristic of the easy-to-manufacture ultrathin piezoelectric resonator with the overall electrode deposited over one side of the piezoelectric block 1 without increasing its equivalent resistance.

Figure 5:
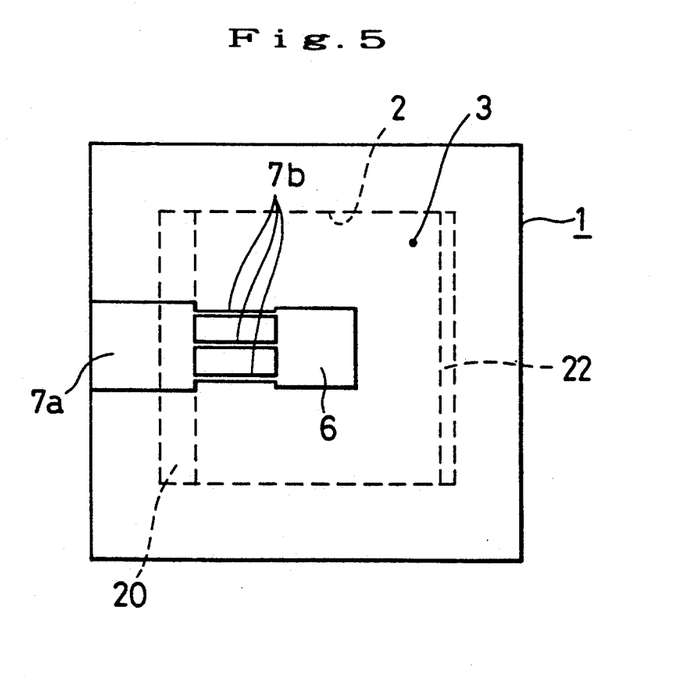
FIG. 5 is a plane view showing the application of the fourth embodiment to such an ultrathin block of the piezoelectric material as shown in FIG. 6 (a) through (c) are a plane view illustrating an example of a piezoelectric resonator employing an ultrathin piezoelectric plate in accordance with a fifth embodiment of the present invention and sectional views respectively taken on the lines A—A and B—B in FIG. 6 (a)

FIG. 5 shows an application of the electrode structure of the fourth embodiment to the ultrathin piezoelectric block 1 including such unetched portions 20 and 22 as depicted in FIG. 2. In this case, the pad 7a lying on the frame-like marginal portion 4 is extended to the portion corresponding to the unetched portion 20 and the electrode lead portion 7 on the vibratory portion 3 is formed by a plurality of narrow electrode lead patterns 7b. In this instance, the area of the electrode lead pattern 7b is shortend—this affords further reduction of the level of the spurious by the electrode lead portion 7b and, at the same time, decreases the ohmic loss of the electrode lead portion and the equivalent parallel capacitance of the resonator.

The ultrathin piezoelectric resonator is suitable for housing in, for example, a ceramic-sintered dish-like package such as shown in FIG. 17. That is, it is effective in simplifying the manufacturing process of the device to house the piezoelectric block 1 with the cavity 2 facing down toward the bottom of the package 8 and electrically connect and mechanically fix the aluminum electrode film 5 on the frame-like marginal portion 4 of the block 1 and the aluminum film 10 on the bottom of the package 8 through use of the conductive adhesive 9.

In this case, however, the conduction between the aluminum electrode film 5 and the aluminum film 10 on the bottom of the package 8 is inevitably insufficient, because the surfaces of such aluminum films readily oxidize to form alumite as mentioned previously.

The third object of the present invention is to solve the above-mentioned problem of the ultrathin piezoelectric resonator.

A fifth embodiment of the present invention therefor will hereinbelow be described in detail.

Figure 6A:
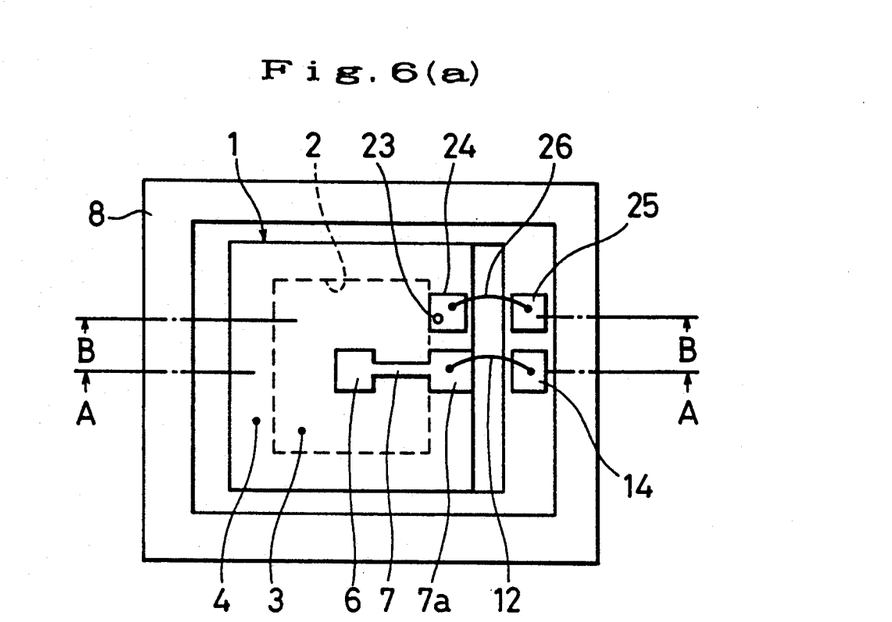
Figure 6B:
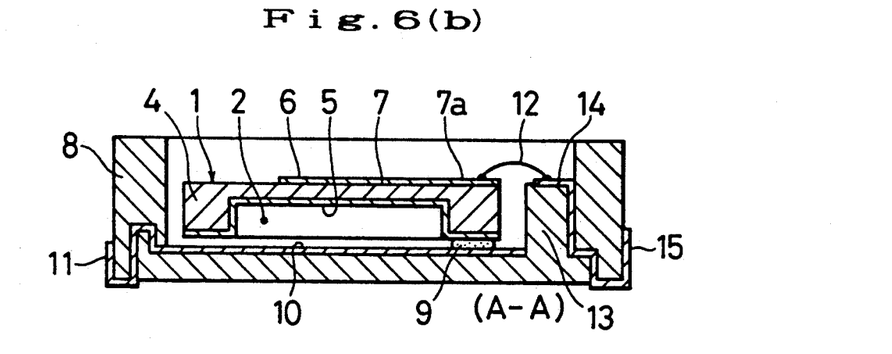
Figure 6C:
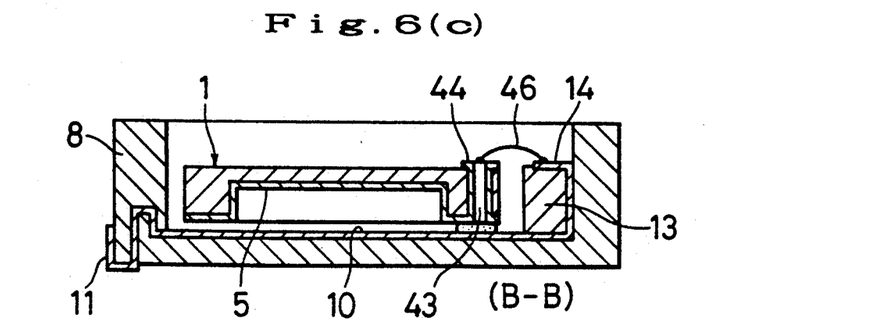

FIG. 6(a), (b) and (c) are a plane view showing the state in which the resonator using the ultrathin piezoelectric plate according to the present invention is fixedly mounted in the package, a sectional view taken on the line A—A in FIG. 6(a) and a sectional view taken on the line B—B in FIG. 6(a), respectively. The ultrathin piezoelectric plate has the cavity 2 formed by mechanical grinding or etching in one side of, for example, a rectangular parallelepipedic AT cut quartz crystal block 1 substantially centrally thereof to form the ultra-thin vibratory portion 3 mechanically supported by the surrounding thick frame-like marginal portion 4 formed integrally therewith.

The quartz crystal block 1 of such a configuration has the overall electrode 5 formed by a conductive film deposited all over the block 1 on the side where the cavity 2 is provided and has, on the flat side of the vibratory portion 3 opposite from the overall electrode 5, the partial electrode 6 and the electrode lead 7 extending therefrom. Further, the pad 7a is provided at the end of the lead 7 and the pad 14 leading to an external lead of the package 8 is provided on a stepped portion 13 on the inner wall of the package 8, and the both pads 7a, 14 are connected by the bonding wire 12.

In this instance, to electrically connect the overall aluminum electrode 5 on the quartz crystal block 1 on the side where the cavity is provided and the aluminum film 10 on the bottom of the package 8, by use of the conductive adhesive 9, is likely to cause bad conduction between the both aluminum films. To avoid this, there is made in the vicinity of the pad 14 a through hole 43 which extends through the frame-like marginal portion 4 thickwise thereof. The through hole 43 may be made at the same time as the cavity is formed, and a conductor layer 43a on the interior surface of the hole 43 may also be vapor deposited simultaneously with the vapor deposition of the overall electrode 5. A terminal pad 44 of a predetermined area is formed around the upper open end of the through hole 43 and is connected by a bonding wire 46 to a pad 45 which is provided on the stepped portion 13 on the inner wall of the package 8 in opposing relation to the pad 44 and is connected to an external lead via the aluminum film 10 deposited on the bottom of the package 8. With such a structure, the overall electrode 5 of the resonator and the aluminum film 10 on the bottom of the package 8 need not be bonded by the conductive adhesive as shown in FIG. 19 but may be mechanically joined, and in addition, the aluminum film 10 on the bottom of the package 8 is not necessary.

In many cases, however, such a package as mentioned above has a construction which permits housing therein various devices. For instance, in the case of housing a filter element described later, a conductor film of a large area must be coated on the bottom of the package inside thereof so as to ensure grounding of the case.

If the aluminum film 10 is provided on the bottom of the package, it is preferable that the aluminum film and one of the electrodes (the overall electrode 5 in this instance) of the resonator to be housed be connected by a conductive adhesive to further improve the conduction between the electrode and the lead terminal.

With such an arrangement, even the conduction between the aluminum film 10 on the bottom of the package 8 and the overall electrode 5 is impaired by the oxidation of the surface of the aluminum film 10, the conductor layer 43c on the inner wall of the through hole 43 ensures the conduction between the overall electrode 5 and the pad 44 for connecting it to the external terminal, and hence ensures good conduction between the electrodes deposited on both side of the vibratory portion 3.

As a result, no large capacitance is formed between the overall electrode 5 and the conductive film 10 of the bottom of the package 8, and consequently, the capacitance ratio of the resonator does not increase and the variable range of frequency is able to be enlarged. Hence, this structure is advantageous also from the viewpoint of using the resonator for a voltage controlled quartz crystal oscillator.

While the present invention has been described as being applied to the piezoelectric resonator, any of the embodiments described above is also applicable to an ultrathin multimode filter.

Figure 7:
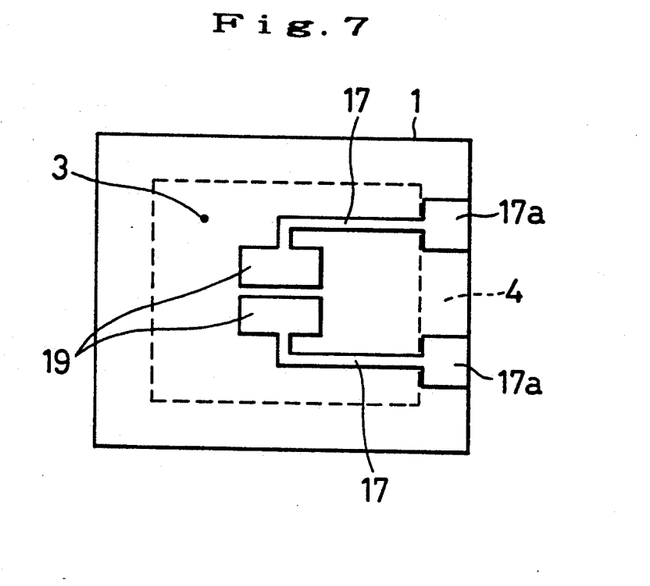
FIG. 7 is a plane view illustrating an example of an ultrathin multimode filter element employing the first embodiment of the present invention.

FIG. 7 illustrates an example of application of the first embodiment of the present invention to an ultrathin dual-mode filter.

As is well-known in the art, a dual-mode piezoelectric filter which is the most common among multimode filters, as a grounding electrode, the overall electrode 5 deposited on one side of a piezoelectric substrate (on the side where the cavity 2 is provided, in this case) and includes split electrodes 19 disposed adjacent each other on the side opposite from the overall electrode 5. Alternating electric fields are applied to the both electrodes to produce therebetween acoustic coupling and the resulting two oscillation modes of different resonance frequencies are utilized to form a band-pass filter.

It is well-known that the bandwidth of such a filter element also decreases with an increase in its equivalent parallel capacitance $C_o$ or capacitance ratio $\gamma$. Hence, it is preferable that electrode leads extending from the split electrodes 19 be narrow on the vibratory portion 3 as indicated by 17 and wide on the frame-like marginal portion 4 as indicated by 17a in FIG. 7.

By this, it is possible to obtain a sufficiently large bandwidth of a microminiature band-pass filter having a center frequency of tens to hundreds of megahertz.

Figure 8:
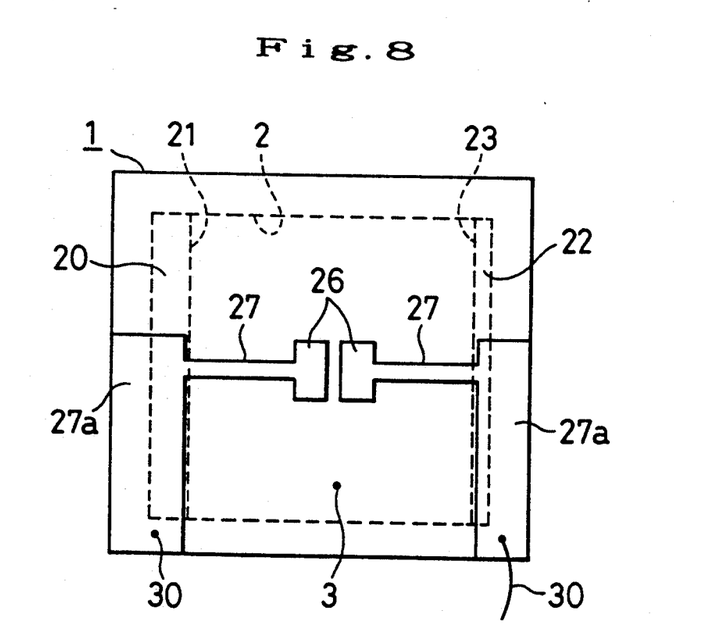
FIG. 8 is a plane view showing an example of an ultrathin multimode filter element utilizing the second embodiment of the present invention.

FIG. 8 illustrates the electrode structure of the ultrathin dual-mode filter element in accordance with the second embodiment of the present invention. In this example, narrow electrodes leads 27,27 are extended from the split electrodes 26,26 to the boundaries 21 and 23 between the unetched portions 20 and 22 and the vibratory portion 3, respectively, and the electrode leads are connected to wide pads 27a, 27a formed between the boundaries and the corresponding marginal edges of the piezoelectric block 1.

Incidentally, each of the pads 27a may also be formed wide as shown so as to attain a high degree of freedom of the position for connection by a bonding wire 30.

With the above-described electrode structure of the ultrathin multimode filter element according to the second embodiment of the present invention, the narrow electrode lead patterns 27, 27 formed on the vibratory portion 3 can be shortened-this serves not only to reduce the ohmic loss (or electrode resistance) but also to lower the capacitance ratio $\gamma$ of the resonator.

Figure 9A:
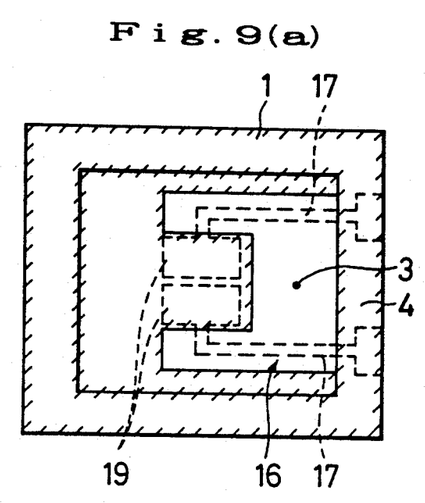
Figure 9B:
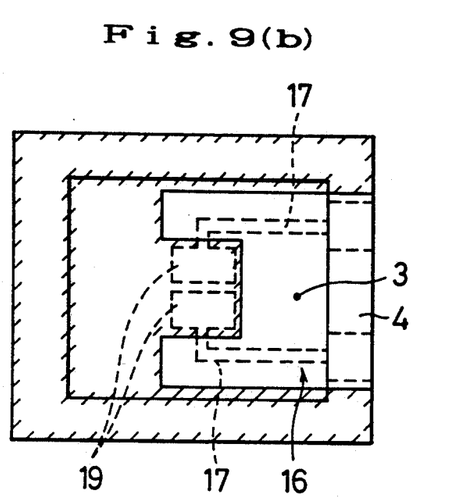

FIGS. 9(a) and (b) show examples of application of the third embodiment of the present invention to the ultrathin multimode filter. In this instance, since it is necessary to extend electrode leads 17, 17 from the split electrodes 19, 19 to marginal edges of the piezoelectric block 1, the conductive film forming the overall electrode 5 on the other side of the piezoelectric block 1 is selectively removed form those areas 16 defined by the both electrode leads 17 and the inner walls of the frame-like marginal portion 4 as shown in FIG. 9(a).

Further, the area 16 over which the conductive film is removed may also be widened to the frame-like marginal portion 4 as depicted in FIG. 9(b).

With such an electrode structure, the capacitance radio r of the piezoelectric resonator can be made equal to the capacitance radio of an ordinary piezoelectric resonator, and consequently, the passband of the filter having a center frequency of tens to hundreds of megahertz can be made larger.

Thus, the multimode filter employing the third embodiment of the present invention is low in capacitance radio and has a wide passband, and this effect compensates for an increase in the number of manufacturing steps which is caused by the use of the above-said electrode structure.

Figure 10:
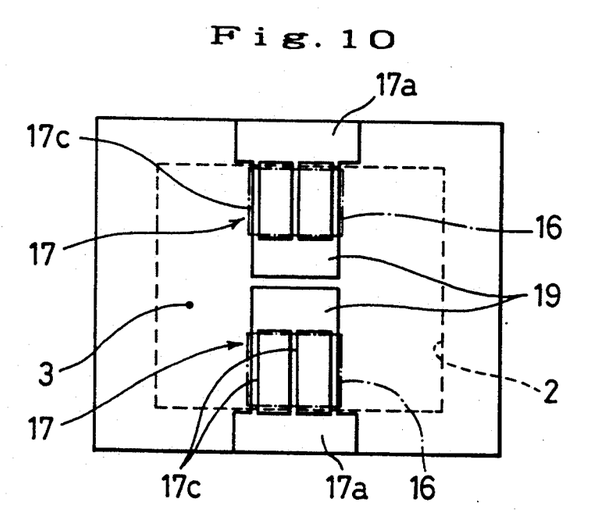
FIG. 10 is a plane view illustrating an embodiment of an ultrathin multimode filter element employing the fourth embodiment of the present invention.

FIG. 10 shows an example of application of the fourth embodiment of the present invention to the dual-mode filter. It is self-evident that, also in the multimode filter element, if the ohmic loss of the electrode lead extending from each split electrode 19,19 is large, the insertion loss of the filter increases accordingly, and if the electrode lead is made wide, a spurious is caused by the electrode lead in the vicinity of the passband of the filter, posing a problem that a desired attenuation cannot be obtained. In view of this, those portions of the electrode leads 17,17 extending from the split electrodes 19, 19 which are formed on the vibratory portion 3 are each formed by a plurality of narrow electrode lead patterns 17c as shown in FIG. 10.

With such an electrode structure, it is possible to reduce the spurious which occurs in the vicinity of the passband of the filter having a center frequency of tens to hundreds of megahertz.

Incidentally, the area indicated by 16 in FIG. 10 is the same as the blank area in FIG. 3. The conductive film forming the overall electrode 5 is selectively removed from the area corresponding to the lead pattern 17c to form the blank area 16, thereby decreasing the parallel capacitance $C_o$.

Figure 11:
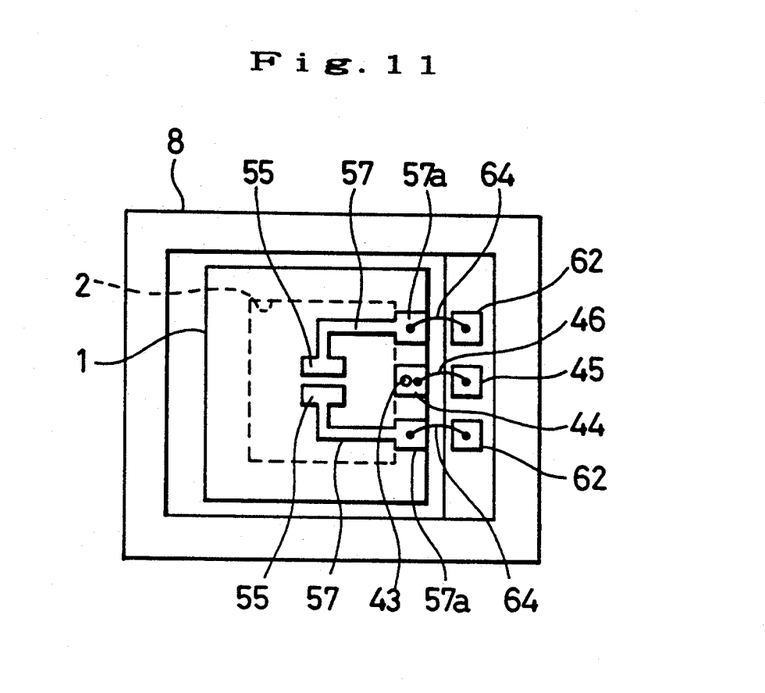
FIG. 11 is a plan view showing a multimode filter element employing the fifth embodiment of the present invention.

FIG. 11 is a plan view of a dual-mode filter showing an example of application of the electrode structure of the ultrathin piezoelectric resonator according to the fifth embodiment shown in FIG. 6 to the dual-mode filter. In this example, electrode leads 57, 57 extending from split electrodes 55, 55, formed on the flat side of the piezoelectric block 1, are connected to pads 57a, 57a formed on one marginal portion of the quartz block 1, which pads form hot terminals are connected by wires 64, 64 to pads 62, 62 formed on an stepped portion 13 on the inner wall of the package 8.

Moreover, the same through hole 43 as shown in FIG. 6 is made in the piezoelectric block 1 between the pads 57a, 57a, and the pad for grounding use 44 is formed around the upper open end of the through hole 43 and is electrically connected to the overall electrode 5 formed on the resonator on the side where the cavity 2 is provided. The pad 44 is also connected by the wire 46 to a grounding pad 45 formed between the pads 62,62 of the package 8.

Needless to say, the pads 62, 62 and 45 each connected to a lead terminals on the outer wall of the package via a lead which hermetically pass through the package 8 respectively.

The dual-mode filter element employing such an electrode structure as described above is built in a very small size of, say, 3 mm by 3 mm to meet recent requirements for microminiaturization and thinning of various pieces of communication equipment. Since the split electrodes 55, 55, the electrode leads 57, 57, the pads 57a, 57a serving as hot terminals of the resonator and the pads 62, 62 as hot terminals of the package are all spaced about 1 mm apart, there is a fear, as mentioned previously, that if the surface of the aluminum overall electrode (the grounding electrode) deposited on the resonator oxidizes to form alumite and the overall electrode is not sufficiently grounded a large stray capacitance occurs between the split electrodes, between the electrode leads, between the hot terminal pads of the resonator and between the hot terminal pads of the package, respectively, resulting in insufficient attenuation in the rejection band at either side of the passband of the filter.

In view of the above, according to the present invention, the grounding electrode (i.e. the overall electrode 5) is sufficiently grounded via the grounding pad 44 (connected to the overall electrode 5 via the through hole 43) disposed between the hot terminal pads 57a, 57a of the resonator and the grounding pad 45 disposed between the hot terminal pads 62, 62 of the package, thereby decreasing the stray capacitance between the hot terminals to secure required attenuation in the rejection band of the filter.

Figure 12:
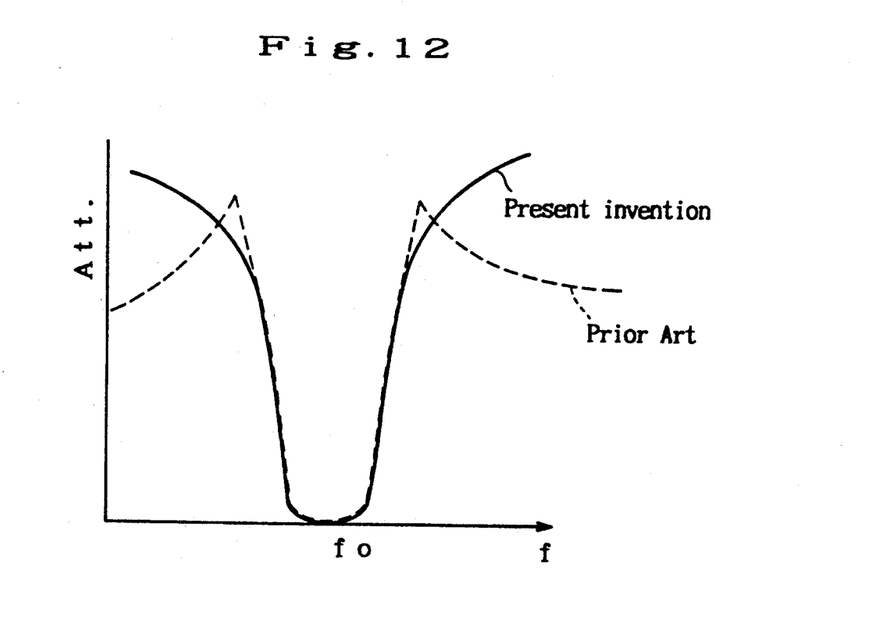
FIG. 12 is a graph showing a characteristic of the filter element depicted in FIG. 11.

FIG. 12 is a graph showing the result of qualitative comparison of the filter characteristics of a filter using a conventional dual-mode filter element and a filter using the filter element according to the present invention. As will be seen form the graph, when the coupling capacitance between the split electrodes 55, 55 and the hot terminals connected thereto is large, that is, when the overall electrode is not sufficiently grounded, a pole appears at the shoulder at either side of the passband of the filter and the attenuation in this portion increases but the attenuation in the rejection band remarkably decreases, whereas in the case of the filter according to the present invention wherein the overall electrode is sufficiently grounded to decrease the stray capacitance between the hot terminals, no pole appears, and hence the attenuation in the rejection band does not decrease.

Figure 13:
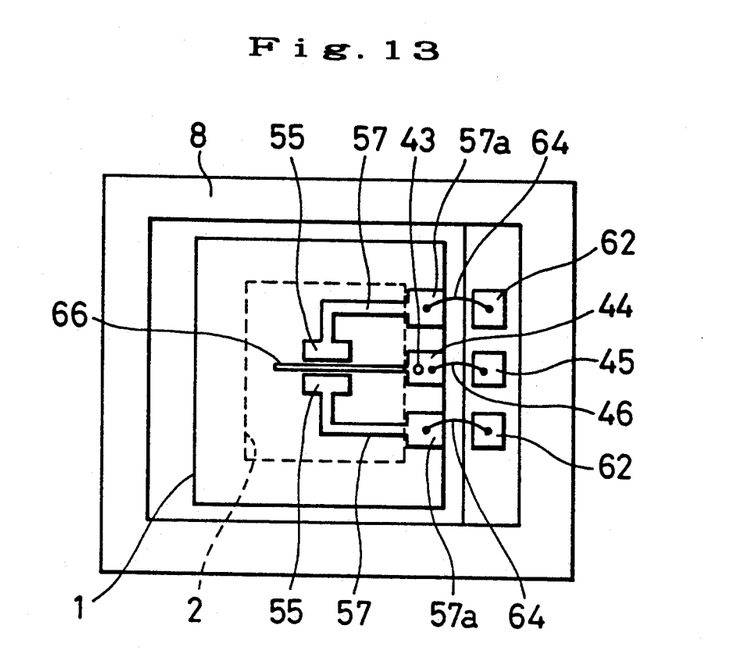
FIG. 13 is a plan view illustrating an embodiment of a multimode filter element provided with a shield electrode.

In FIG. 13 a narrow conductor strip 66 is provided as a shield electrode between the split electrodes 55, 55 and is connected to the grounding pad 44 which is grounded via the bonding wire 46. By this, the stray capacitance between the split electrodes 55, 55, between the leads 57, 57, between the hot terminals 57a, 57a and between the hot terminals 64, 64, respectively, is further reduced.

Figure 14A:
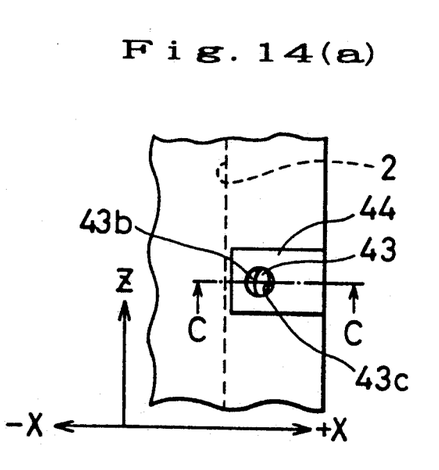
Figure 14B:
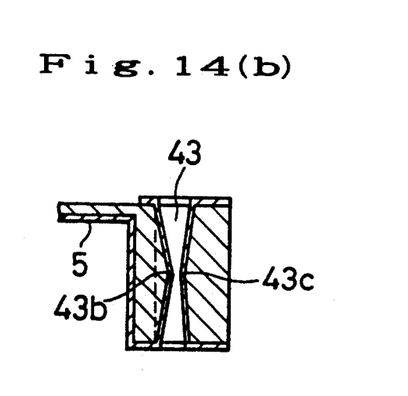

In the ultrathin piezoelectric resonator having the through hole, there is a fear that since an overhang is left unetched on the inner wall of the through hole 43 in the $-x$ axis direction as shown in FIGS. 14(a) and (b) uniform deposition of metal in the through hole is difficult, leading to unstable electrical connection to the overall electrode 5. Incidentally, an overall 43c is slightly formed on the inner wall opposite the overhang 43b (on the $+x$ side) but is not so protrusive as to exert a particular bad influence on the deposition of metal.

Figure 15A:
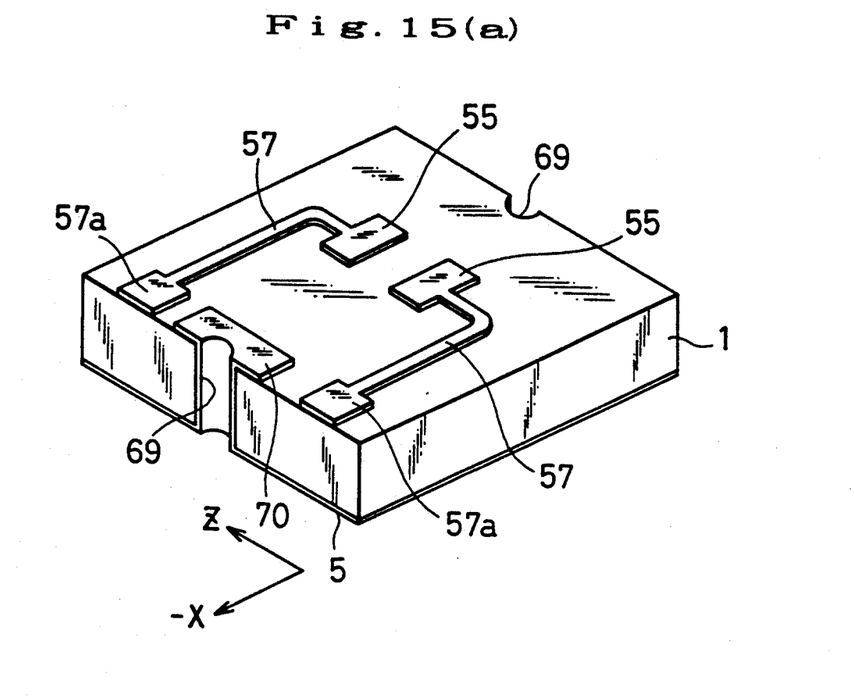

The above-noted problem could be solved by forming a semi-cylindrical recess in one marginal portion of the ultrathin piezoelectric resonator or filter element, for example, in one marginal portion along the Z-axis and by vapor depositing a metallic film on the $+x$ side inner wall of the recess as shown in FIG. 15(a).

Figure 15B:
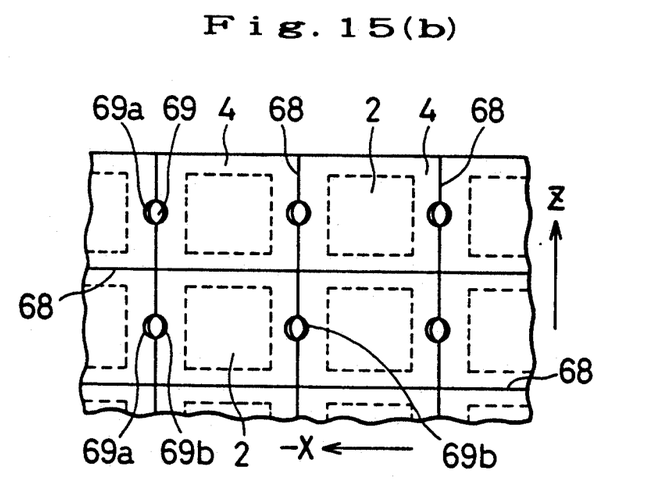

In the fabrication of the ultrathin piezoelectric resonator a large piezoelectric wafer with a number of resonators formed thereon simultaneously as depicted in FIG. 15(b) is cut into individual resonators. Then, large-diametered through holes 69 are made in the wafer across cutting lines 68 thereof 68 simultaneously with the formation of the cavity 2 of each resonator, metal is vapor deposited on the inner walls of the through holes 69 at the same time as the overall electrode is vapor deposited, and after cutting the wafer, the $+x$ side inner wall of each through hole 69 sufficiently deposited with the metal film is used to establish sufficient electrical connection between the overall electrode 5 and a grounding pad 70.

With the multimode filter element of the above construction, it is possible to secure sufficient electrical connection between the overall electrode of the ultrathin piezoelectric resonator and the conductive film deposited on the bottom of the package inside thereof. This prevents bad electrically connection between the external lead extending from the conductive film on the inner bottom of the package and the overall electrode of the resonator and hinders an increase in the stray capacitance resulting from insufficient grounding of the overall electrode, thus effectively lightening the restriction on the passband of the filter by an increase in the capacitance radio of the resonator and preventing the attenuation characteristic.

The ultrathin piezoelectric resonator having the through hole according to the fifth embodiment of the present invention is not limited specifically to the examples of FIG. 6, 11 and 13 through 15 but is also applicable to the ultrathin piezoelectric resonators of the filter through fourth embodiments.

We claim:

1. An electrode structure for an ultrathin piezoelectric resonator, comprising:
    a piezoelectric plate having two opposite major sides, wherein a cavity is formed in only one of the major sides forming an ultrathin vibratory portion and a thick frame-like marginal portion formed integrally with and entirely surrounding said vibratory portion;
    an overall electrode formed over the entire surface of said one major side of the piezoelectric plate;
    a partial electrode formed on the ultrathin vibratory portion of the other major side of the piezoelectric plate; and
    an electrode lead extending from said partial electrode to a marginal edge of said piezoelectric plate;
    wherein a portion of said electrode lead formed on said marginal portion of the piezoelectric plate is wider than a portion of said electrode lead formed on said vibratory portion of the piezoelectric plate.

2. An electrode structure for an ultrathin piezoelectric resonator, comprising:
    a piezoelectric plate including an ultrathin vibratory portion and a thick frame-like marginal portion formed integrally with and surrounding said vibratory portion, an inner side wall portion of a cavity defined by said frame-like marginal portion being gradually inclined toward said vibratory portion;
    an overall electrode provided over the entire surface area of the side of said piezoelectric plate in which the cavity is formed;
    a partial electrode provided on said vibratory portion on the side of said piezoelectric plate opposite said overall electrode;
    a conductive pad provided on said opposite side of said piezoelectric plate from one marginal edge thereof to a boundary between said inner side wall portion of said cavity and said vibratory portion; and
    an electrode lead pattern connecting said conductive pad and said partial electrode, wherein said electrode lead pattern is narrower than said conductive pad and said partial electrode.

3. The electrode structure as claimed in claim 1 or 2, wherein said conductive pad and said partial electrode are coupled together by a plurality of very narrow electrode lead patterns.

4. An electrode structure for an ultrathin piezoelectric resonator, comprising:
    a piezoelectric plate having two opposite major sides, wherein a cavity is formed in only one of the major sides forming an ultrathin vibratory portion and a thick frame-like marginal portion formed integrally with and entirely surrounding said vibratory portion;
    a partial electrode formed on the ultrathin vibratory portion of the other major side of the piezoelectric plate and having an electrode lead extending therefrom to a marginal edge of said piezoelectric plate; and
    an overall electrode formed over the entire surface of said one major side of the piezoelectric plate except in a region opposite said electrode lead.

5. An electrode structure for an ultrathin piezoelectric resonator, comprising:
    a piezoelectric plate having two opposite major sides, wherein a cavity is formed in only one of the major sides forming an ultrathin vibratory portion and a thick frame-like marginal portion formed integrally with and entirely surrounding said vibratory portion;
    an overall electrode formed over the entire surface of said one major side of the piezoelectric plate;

a partial electrode formed on the ultrathin vibratory portion of the other major side of the piezoelectric plate; and an electrode lead extending from said partial electrode to a marginal edge of said piezoelectric plate, said electrode lead comprising two or more narrow lead patterns.

6. An electrode structure for an ultrathin piezoelectric resonator, comprising:

a piezoelectric plate having two opposite major sides, wherein a cavity is formed in only one of the major sides forming an ultrathin vibratory portion and a thick frame-like marginal portion formed integrally with and entirely surrounding said vibratory portion;

an overall electrode formed over the entire surface of said one major side of the piezoelectric plate and electrically connected via an aperture formed in the marginal portion to a terminal pad formed on the other major side of the piezoelectric plate;

a partial electrode formed on the ultrathin vibratory portion of the other major side of the piezoelectric plate; and an electrode lead extending from said partial electrode to the marginal portion.

7. An electrode structure for an ultrathin piezoelectric resonator as claimed in claim 6, wherein said aperture is a recess formed along an outer wall of said marginal portion between said two sides of the piezoelectric plate, and wherein an inner wall of said recess is coated with a conductive layer.

* * * * *